United States Patent [19]

Shipman

[11] Patent Number: 5,704,035
[45] Date of Patent: Dec. 30, 1997

[54] COMPUTER METHOD/APPARATUS FOR PERFORMING A BASIC INPUT/OUTPUT SYSTEM (BIOS) POWER ON TEST (POST) THAT USES THREE DATA PATTERNS AND VARIABLE GRANULARITY

[75] Inventor: Mark S. Shipman, Portland, Oreg.

[73] Assignee: Intel Corporation, Santa Clara, Calif.

[21] Appl. No.: 675,423

[22] Filed: Jul. 3, 1996

Related U.S. Application Data

[63] Continuation of Ser. No. 283,206, Jul. 28, 1994, abandoned.

[51] Int. Cl.$^6$ ............................................. G06F 13/00
[52] U.S. Cl. ............................................. 395/183.18
[58] Field of Search .................. 395/183.18, 185.05, 395/185.06, 185.07; 371/21.1, 21.2, 21.3, 27

[56] References Cited

U.S. PATENT DOCUMENTS

| | | | |
|---|---|---|---|
| 5,006,787 | 4/1991 | Katirciogula | 324/73.1 |
| 5,051,997 | 9/1991 | Sakashita | 371/22.4 |
| 5,173,906 | 12/1992 | Dreibelbis et al. | 371/22.5 |
| 5,471,482 | 11/1995 | Byers et al. | 371/21.2 |

Primary Examiner—Robert W. Beausoliel, Jr.
Assistant Examiner—Norman M. Wright
Attorney, Agent, or Firm—Blakely, Sokoloff, Taylor & Zafman

[57] ABSTRACT

A method and apparatus in a personal computer for performing a basic input/output system (BIOS) power on system test (POST) that uses three data patterns. The first data pattern (plus Inverse pattern) is used to test data bit integrity. the second data pattern (plus inverse pattern) encoded by address is used to test address line integrity. The third pattern is a pattern where all bits are null. Each pattern is 64 bits wide (a 32 bit data pattern plus 32 bit inverse data pattern). The test uses the Processor or Main Memory Controller's Byte Enables to speed the execution of the test. This is optimized for both 32 and 64 bit data paths. The invention has the advantage that it uses a 64 Bit data test, finds Data Bit and Address Line failures, tests boundary conditions rather than every data point, and results in very fast execution.

9 Claims, 5 Drawing Sheets

COMPUTER METHOD/APPARATUS FOR PERFORMING A BASIC INPUT/OUTPUT SYSTEM (BIOS) POWER ON TEST (POST) THAT USES THREE DATA PATTERNS AND VARIABLE GRANULARITY

This is a continuation of application Ser. No. 08/283,206, filed Jul. 28, 1994, now abandoned.

BACKGROUND OF THE INVENTION

1. Field of the Invention

The present invention is related to personal computers and more particularly to a method and apparatus for performing a basic input/output system (BIOS) power on system test (POST).

2. Background Art

When a user turns a computer power switch on, or presses a reset button, the computer "boots" itself, a term that is shorthand for pulling itself up by the bootstraps. Booting initiates an automatic start program routine that clears memory, executes diagnostics, loads a computer operating system software program into memory from disk storage and executes other routines that prepare the computer for use.

In personal computers that are compatible with the IBM PERSONAL COMPUTER, the automatic start program includes a set of programs called basic input/output system (BIOS) that are encoded in read-only memory (ROM). The BIOS facilitates the transfer of data and instructions between a central processing unit (CPU) and peripheral devices such as disk drives. Computer systems are designed to perform functional tests from the BIOS every time the computer is turned on.

Competition between different brands of computers is vigorous, so a way of differentiating one brand from another can be a significant competitive advantage. Also, read only memory (ROM) by its very nature is small and expensive, so reducing the amount of code to be permanently stored in ROM can significantly reduce the overall cost of a computer.

It is therefore an object of the invention to provide a basic input/output system (BIOS) power on system test (POST) that is functionally equivalent in level of testing to prior memory test algorithms but executes in a fraction of the time.

It is also an object of the invention to provide a basic input/output system (BIOS) power on system test (POST) that requires less code to execute as compared with prior memory test algorithms.

SUMMARY OF THE INVENTION

Briefly, the above objects are accomplished in accordance with the invention by providing a memory test that uses three data patterns. The first data pattern (plus Inverse pattern) is used to test data bit integrity. The second data pattern (plus inverse pattern) encoded by address is used to test address line integrity. The third pattern is a pattern where all bits are null. Each pattern is 64 bits wide (a 32 bit data pattern plus 32 bit inverse data pattern). The test uses the Processor or Main Memory Controller's Byte Enables to speed the execution of the test. This is optimized for both 32 and 64 bit data paths.

The invention has the advantage that it uses a 64 Bit data test, finds Data Bit and Address Line failures, tests boundary conditions rather than every data point, and results in very fast execution.

The invention has the further advantage that it employs a variable length test.

The invention has the further advantage that its test runs in 'Real Big' mode so that no real to protected mode swapping is needed.

The invention has the further advantage that it tests and initializes memory in a single step, no recursive calls or complex algorithms.

A further advantage of this invention is that it allows for reduced code size in a basic input/output system (BIOS) program.

A further advantage of this invention is that it significantly the reduces amount of time an end user waits for memory to be tested.

The foregoing and other objects, features, and advantages of the invention will be apparent from the following more particular description of a preferred embodiment of the invention as illustrated in the accompanying drawings.

DESCRIPTION OF THE PREFERRED EMBODIMENT

Figure 1:
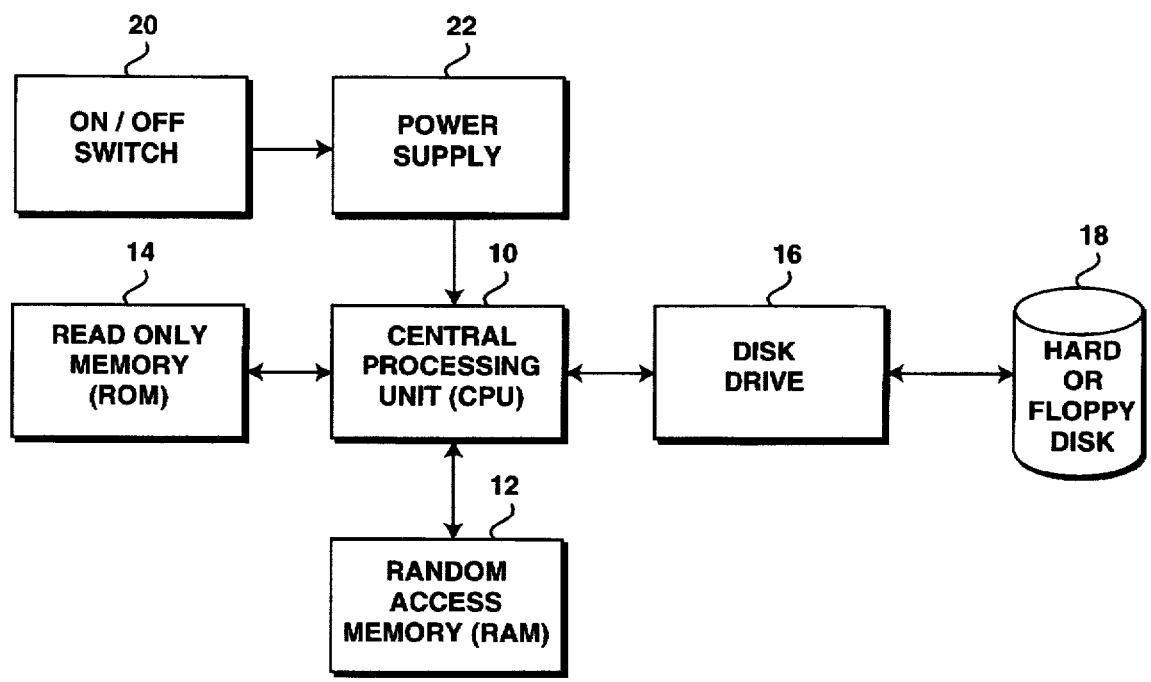
FIG. 1 is a block diagram of a computer system in which the present invention is embodied.

Refer to FIG. 1. A computer system is shown which includes a central processing unit, CPU, (10), that is connected to a random access memory, RAM (12), a read only memory, ROM, (14), and a disk drive (16) that reads and writes a hard or floppy disk (18). A power supply (22) supplies power to each of the components of the computer. An on/off switch (20) connects the power supply to a source of electricity.

When a user turns the on/off switch (20) on, or presses a reset button, the computer "boots" itself, a term that is shorthand for pulling itself up by the bootstraps. Booting initiates an automatic start program routine that is stored in read-only memory, ROM, (14). Unlike the RAM (12), the ROM (14) contents are not destroyed when power is turn off. In personal computers that are compatible with the IBM PERSONAL COMPUTER the automatic start program includes a set of programs called basic input/output system (BIOS) that are encoded in ROM (18). The BIOS facilitates the transfer of data and instructions between the CPU (10) and the disk drive (16). The BIOS clears memory, executes diagnostics and executes other routines that prepare the computer for use. The auto start program instructs the CPU to read the first track of the hard or floppy disk (18). This loads a computer operating system software program into memory from disk storage. The BIOS includes a power on system test (POST) software routine that performs tests of the computer's memory.

In accordance with the present invention, the first 8 bytes (corresponding to the lower three address lines) of each memory partition is tested by virtue of the Processor or Main Memory Controller's Byte Enables, no additional test code is required. This is accomplished by skipping the testing of the lower three address lines and using a 64-bit pattern/reverse pattern test. A memory test in accordance with the invention uses variable granularity. It uses address line bit shift (new address={(old address MOD granularity) SHL 1}+old address) inside the granularity range. It uses incremental (new address=old address granularity) to address each block of size "granularity". Each memory partition (of size "granularity") is tested using said shifting address algorithm. This provides full address and data line testing of a block of memory without having to do single cell testing.

Memory testing and subsequent update of status to a video monitor are all done in 'Real Big' mode as opposed to constantly switching between Real and Protected Mode. 'Real Big' mode is a mode where the data segment registers of the processor are loaded with Protected Mode type characteristics while the code and stack segment registers retain their Real Mode characteristics. The processor essentially runs in Real Mode while allowing a full 4 GB access to memory.

Description of Flow Charts for Memory Test

Figure 2:
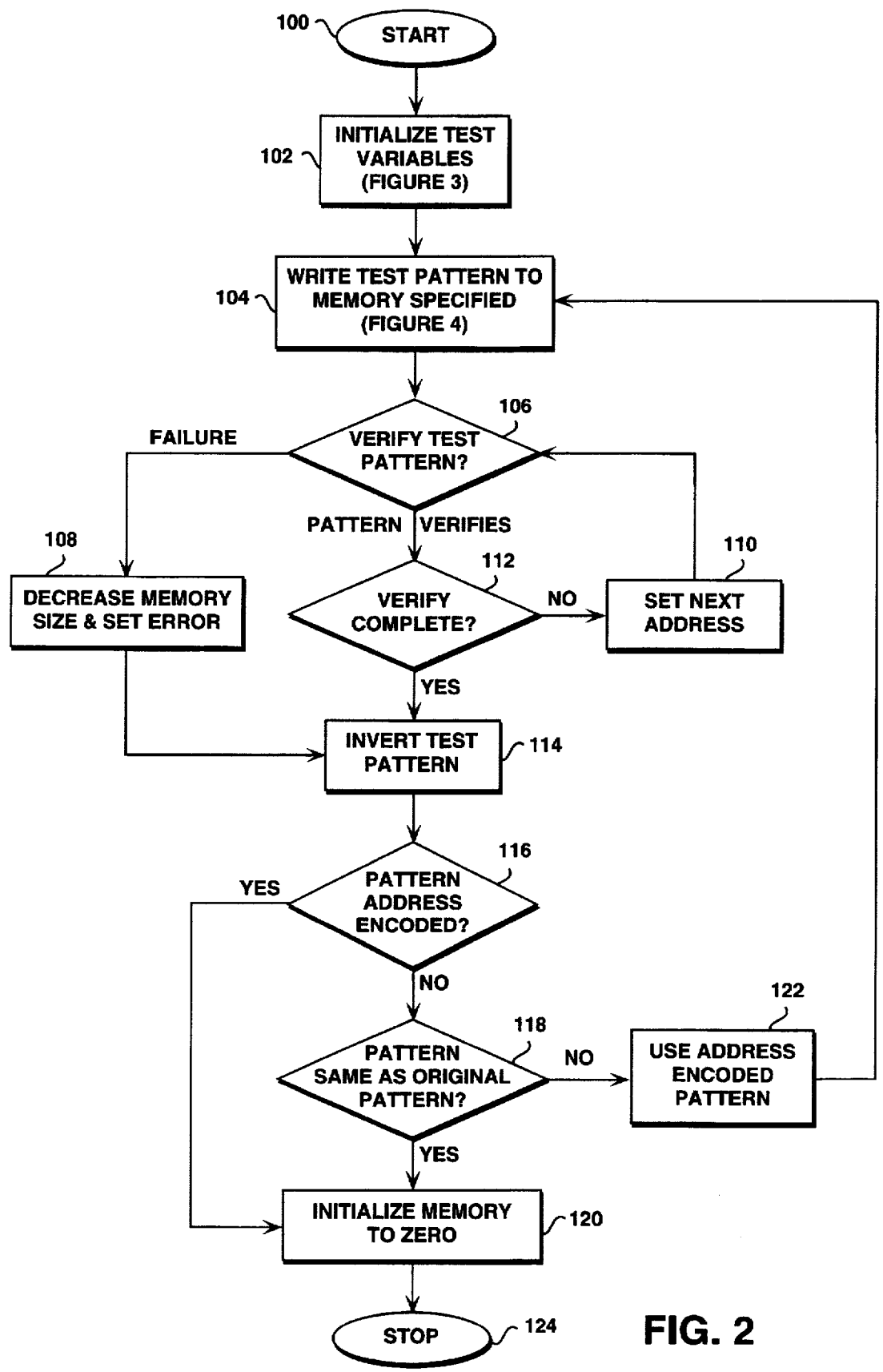
FIG. 2 is a flow chart of a memory test main program.

Refer to FIG. 2. At the start (100) of the memory test, parameters are passed from the calling program code in the ROM (14). These parameters include the amount of memory to test (the memory test size), the resolution in which to test (the test granularity),and the base address of memory to test. The flow proceeds to block (102) where the program initializes Test Variables by entering a Test Variables subroutine shown in FIG. 3.

Figure 3:
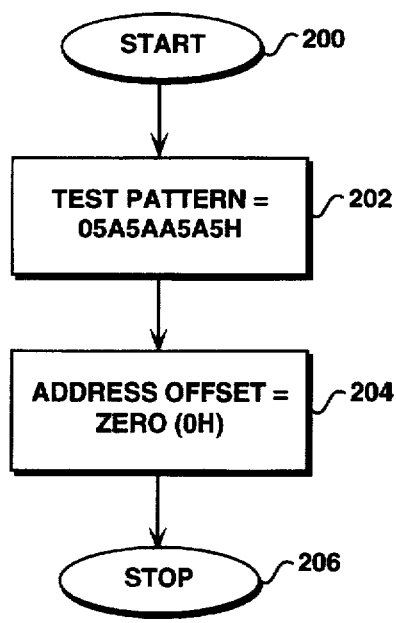
FIG. 3 is a flow chart of the test variables subroutine shown in FIG. 2.

Refer to FIG. 3. The Test Variables subroutine starts (200). The flow proceeds to block (202). The test pattern used is a 64 bit pattern that consists of two 32 bit sub patterns. One sub pattern is a alternating bit pattern (05A5Ah) and the second sub pattern is the inverse of the first sub pattern (A5A5h). The flow proceeds to block (204). The test is run using the base address plus an address offset. The base address remains the same throughout the test. The address offset starts at zero and is incremented throughout the test address range. The flow proceeds to block (206). The program stops the Initialize Test Variables subroutine and returns to FIG. 2.

At block (104) of FIG. 2, the program writes the test pattern to the memory locations specified by the base address plus offset. This writes the 64 bit pattern throughout the range of memory specified in the memory test size. The flow proceeds to a pattern write subroutine of FIG. 4.

Figure 4:
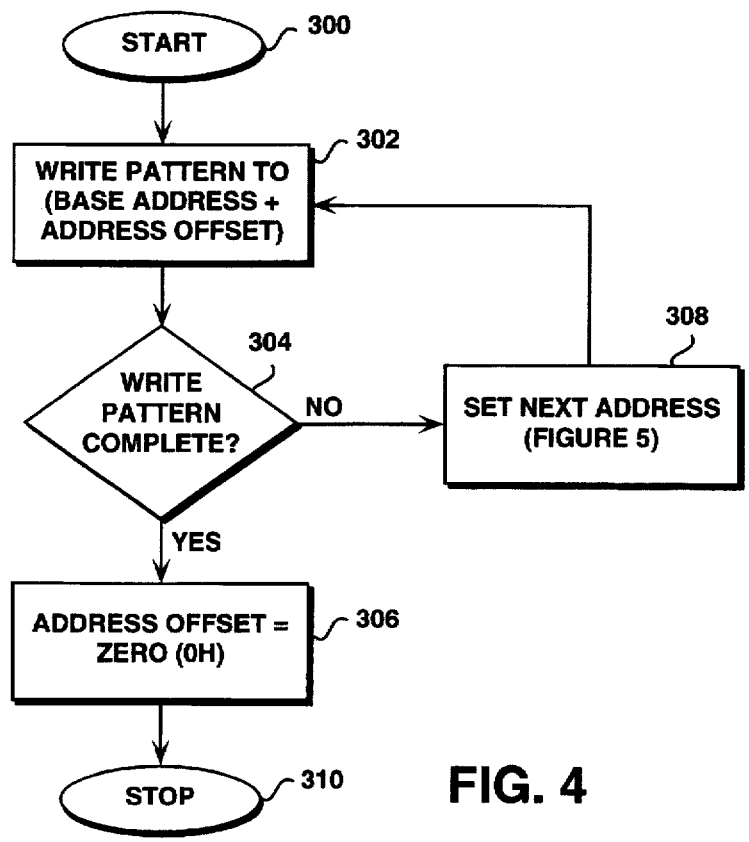
FIG. 4 is a flow chart of the pattern write subroutine shown in FIG. 2.

Refer to FIG. 4. The pattern write subroutine starts (300). The program writes the test pattern to the 64 bit memory location specified by Base Address+Address offset (302). The flow proceeds to block (304). The program checks to see if the test pattern has been written throughout the size of test specified (304). This is done by checking to see if the Address Offset is greater than or equal to the size of test specified. If the writing of the test pattern is complete (YES), then the flow proceeds to block (306). At block (306) the program resets the Address Offset to zero for the validation of data patterns and the flow stops the pattern write subroutine (310).

If at block (304) the writing of the test pattern is not complete (NO), then the flow proceeds to block (308). At block (308) the program executes a set next address subroutine shown in FIG. 5.

Figure 5:
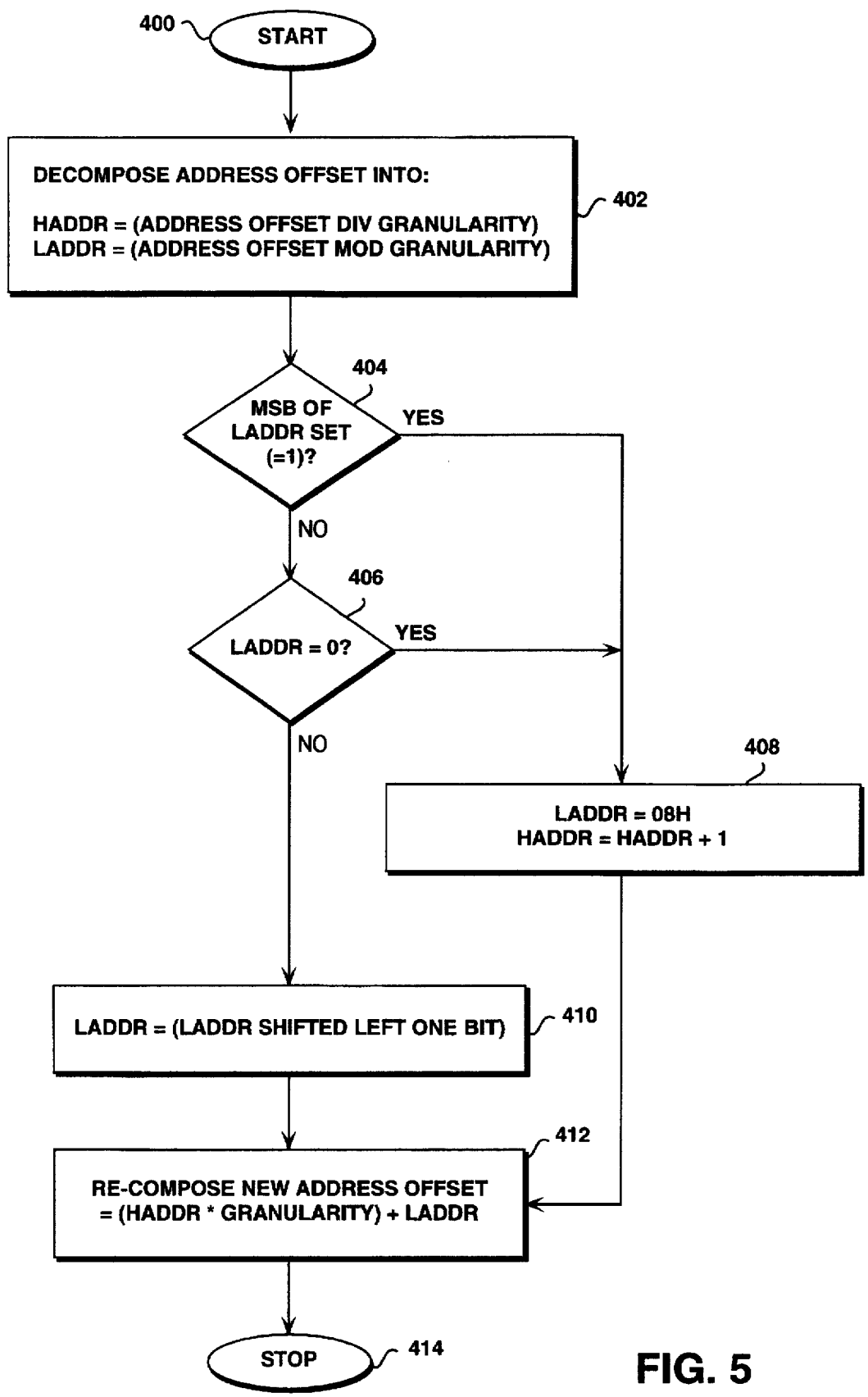
FIG. 5 is a flow chart of the set next address subroutine shown in FIG. 2 and FIG. 4.

Refer to FIG. 5. The set next address subroutine starts (400). At block (402) the subroutine decomposes the address offset into two portions. The first portion is HADDR (High ADDRess). HADDR=Address Offset divided by the granularity of the test. HADDR is the most significant address bits above the granularity range. The second portion is LADDR (Lower ADDRess). LADDR=Address Offset MOD Granularity. LADDR is the address bits that are within the size of the test granularity. The flow proceeds to decision block (404).

At decision block (404), if the Most Significant Bit (MSB) of LADDR is set (YES), the flow proceeds to decision block (408). At block (408) the program sets LADDR=08 h and increments HADDR by 1. The flow proceeds to block (412). At block (412) the subroutine recomposes a new address offset. Address Offset (HADDR multiplied by the Granularity of Test)+LADDR. The flow then stops (414) and the set next address subroutine returns to the flow of FIG. 4.

At decision block (404), if the Most Significant Bit of LADDR is not set (NO), the flow proceeds to decision block (406). At decision block (406) if the LADDR is zero (YES) the flow proceeds to block (408) described above. At decision block (406) if the LADDR is not zero (NO) the flow proceeds to block (410).

At block (410) the subroutine shifts LADDR left one bit and the flow proceeds to block (412). At block (412) the subroutine recomposes a new address offset. Address Offset (HADDR multiplied by the Granularity of Test)+LADDR. The flow then stops (414) and the set next address subroutine returns to the flow of FIG. 4.

Refer to FIG. 4. At completion of the set next address subroutine, block (308), the flow continues at block (302). The program writes the test pattern to a 64 bit memory location specified by Base Address+Address offset (302). The flow proceeds to block (304). The program checks to see if the test pattern has been written throughout the size of test specified (304). This is done by checking to see if the Address Offset is greater than or equal to the size of test specified. If the writing of the test pattern is complete (YES), then the flow proceeds to block (306). At block (306) the program resets the Address Offset to zero for the validation of data patterns and the flow stops pattern write (310) and returns to the main flow of FIG. 2.

Refer to FIG. 2. The main flow proceeds to block (106) to verify that the current data pattern at the current address (the address currently being pointed to) is identical to the original data pattern written. If the pattern verifies (YES), the flow proceeds to decision block (112). If pattern fails to verify (NO), the flow proceeds to block (108).

At decision block (112) a check is made to verify that every address has been written, that is to check that the address offset is greater than the size of the test. If YES, the flow proceeds to block (114). If NO, the flow proceeds to block (110) and enters the set next address subroutine described above with reference to FIG. 5.

At block (114), the program inverts all bits in the test pattern and the flow proceeds to decision block (116). At decision block (116) the program checks to see if for this pass through the test an address encoded pattern is being used. If YES, the flow proceeds block (120). If NO, the flow proceeds to decision block (118).

At decision block (118) the program checks to see if the pattern is the same as the original pattern used. If YES, flow proceeds to block (120), If NO, the flow proceeds to block (122).

At block (120), the program sets all memory in range tested to zero. The flow proceeds to block (124) to stop the memory test.

In the flow of FIG. 2 at decision block (106) the program checks to verify that the current data pattern at the current address (the address currently being pointed to) is identical to the original data pattern written. If the data pattern fails to verify (NO), the flow proceeds to block (108) to execute a Decrease Memory Size and Set error subroutine.

Figure 6:
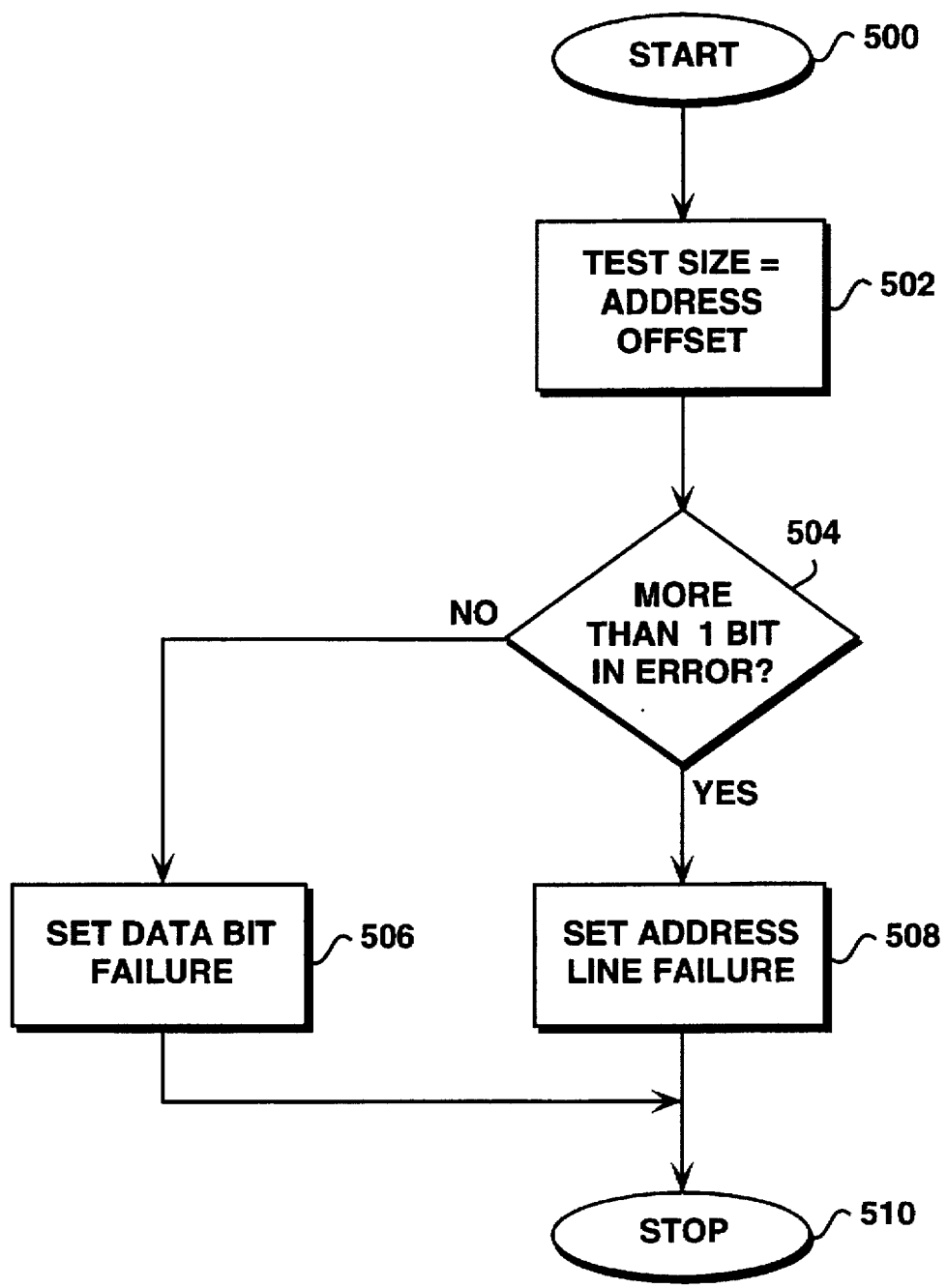
FIG. 6 is a flow chart of the decrease memory size and set error subroutine shown in FIG. 2.

Refer to FIG. 6. The program starts the Decrease Memory Size and Set error subroutine (500). The flow proceeds to block (502) where the subroutine sets the Test size to the address offset. (Size=memory tested good). The flow proceeds to decision block (504) where the subroutine checks to see if there is more than one bit in error. If YES the flow proceeds to block (508). At block (508) the subroutine indicates address line failure and stops (510) decrease memory size and set error subroutine. The program returns to the main flow block (114) of FIG. 2.

If at decision block (504), wherein the subroutine checks to see if there is more than 1 bit in error, a NO occurs, the flow proceeds to block (506). At block (506) the subroutine indicates data bit failure and stops (510) decrease memory size and set error subroutine. The program returns to the main flow block (114) of FIG. 2.

While the invention has been particularly shown and described with reference to preferred embodiments thereof, it will be understood by those skilled in the art that the foregoing and other changes in form and detail may be made therein without departing from the scope of the invention.

What is claimed is:

1. A method of testing a memory, comprising the steps of:
   a. determining a memory test size representing an amount of the memory to test, a base address of the memory to begin testing, and a granularity corresponding to a variable testing resolution;
   b. initializing an address offset;
   c. writing a first data pattern to a portion of memory identified by the base address+address offset;
   d. recomputing the address offset in accordance with the address offset and the granularity; and
   e. repeating steps c–d until the address offset exceeds the memory test size.

2. The method of claim 1 further comprising the steps of:
   f. initializing the address offset;
   g. verifying the first pattern is stored in the portion of memory identified by the base address+address offset;
   h. recomputing the address offset in accordance with the address offset and the granularity; and
   i. repeating steps g–h until the address offset exceeds the memory test size.

3. The method of claim 2, wherein step g further comprises the steps of:
   1. performing the following step, if a value stored in the portion of memory does not match the first data pattern:
      i. setting the memory test size=address offset, if the value does not match at least a portion of the first data pattern.

4. The method of claim 3 further comprising the steps of:
   ii. determining a error number corresponding to a number of bits in error;
   iii. indicating a data bit failure, if the error number is one; and
   iv. indicating an address line failure, if the error number is greater than one.

5. The method of claim 3 wherein step 1 further comprises the step of:
   1. writing zeroes to every memory location within a memory range beginning with base address to base address+memory test size.

6. The method of claim 2 wherein steps d and h further comprise the steps of:
   1. computing HADDR=address offset/granularity;
   2. computing LADDR=address offset MOD granularity;
   3. computing LADDR=LADDR*2, if the most significant bit of LADDR is zero and LADDR#0;
   4. computing HADDR=HADDR+1 and LADDR= granularity, unless the most significant bit of LADDR is zero and LADDR#0;
   5. incrementing the address offset by (HADDR*granularity+LADDR).

7. The method of claim 2 further comprising the steps of:
   j. inverting the first data pattern;
   k. returning to step b using an address encoded pattern if the inverted first data pattern is not address encoded and the inverted first data pattern was not previously used; and
   l. initializing the memory, unless the inverted first data pattern is not address encoded and the inverted first data pattern was not previously used.

8. The method of claim 1 wherein the first data pattern includes an alternating bit pattern.

9. The method of claim 8 wherein the first data pattern includes a first subpattern and a second subpattern, wherein the second subpattern is complementary to the first subpattern.

* * * * *